US008689168B1

(12) United States Patent
Baumann et al.

(10) Patent No.: US 8,689,168 B1
(45) Date of Patent: Apr. 1, 2014

(54) RELIABILITY DETERMINATION TAKING INTO ACCOUNT EFFECT OF COMPONENT FAILURES ON CIRCUIT OPERATION

(71) Applicant: Texas Instruments Incorporated, Dallas, TX (US)

(72) Inventors: Robert Christopher Baumann, Dallas, TX (US); John Michael Carulli, Jr., Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/630,726

(22) Filed: Sep. 28, 2012

(51) Int. Cl.
*G06F 17/50* (2006.01)

(52) U.S. Cl.
USPC .......................................................... 716/136

(58) Field of Classification Search
USPC ........... 716/136; 702/34, 60, 181, 182; 703/2, 703/14; 714/37
See application file for complete search history.

(56) References Cited

U.S. PATENT DOCUMENTS

| 2004/0167731 A1* | 8/2004 | Wang et al. ...................... 702/60 |
| 2007/0239368 A1* | 10/2007 | Marrano et al. ................ 702/34 |
| 2011/0010140 A1* | 1/2011 | Hoitsma et al. ................... 703/2 |

\* cited by examiner

*Primary Examiner* — Vuthe Siek
(74) *Attorney, Agent, or Firm* — Wade J. Brady III; Frederick J. Telecky, Jr.

(57) ABSTRACT

A method includes testing to failure a plurality of semiconductor test structures, measuring a parameter of each semiconductor test structure after experiencing a failure, and generating a cumulative probability distribution function (CPDF) of cumulative probability versus the measured parameter after failure for the plurality of semiconductor test structures. The method further includes performing simulations for a circuit having an area using a model of a transistor that mimics the failure to determine a parameter threshold value that defines a minimum acceptable performance level of the circuit, determining a cumulative probability value from the CPDF that a transistor will not have the parameter at a level below the parameter threshold value, adjusting a value of the area of the circuit based on the cumulative probability value, and computing a first reliability value based on the adjusted area value.

11 Claims, 3 Drawing Sheets

RELIABILITY DETERMINATION TAKING INTO ACCOUNT EFFECT OF COMPONENT FAILURES ON CIRCUIT OPERATION

CROSS-REFERENCE TO RELATED APPLICATION

N/A

BACKGROUND

A circuit generally refers to a configuration of electrically coupled components or devices. Integrated circuits (ICs), printed circuit boards (PCBs), IC packages with connection leads, are examples of circuits. Before production begins, the reliability of a circuit is evaluated, in part, through circuit simulations. A circuit that does not achieve a target reliability level (which may vary from circuit to circuit) may need to be redesigned. Redesigning a circuit for increased reliability may result in the circuit operating at a lower performance level or having a larger area to implement the "reliable" version of the same function, as there generally is trade-off between reliability, area, and performance.

SUMMARY

In some implementations, a method includes testing to failure a plurality of semiconductor test structures, measuring a parameter of each semiconductor test structure after experiencing a failure, and generating a cumulative probability distribution function (CPDF) of cumulative probability versus the measured parameter after failure for the plurality of semiconductor test structures. The method further includes performing simulations for a circuit having an area using a model of a transistor that mimics the failure to determine a parameter threshold value that defines a minimum acceptable performance level of the circuit, determining a cumulative probability value from the CPDF that a transistor will not have the parameter at a level below the parameter threshold value, adjusting a value of the area of the circuit based on the cumulative probability value, and computing a first reliability value based on the adjusted area value.

BRIEF DESCRIPTION OF THE DRAWINGS

For a detailed description of exemplary embodiments of the invention, reference will now be made to the accompanying drawings in which.

DETAILED DESCRIPTION

Figure 1:
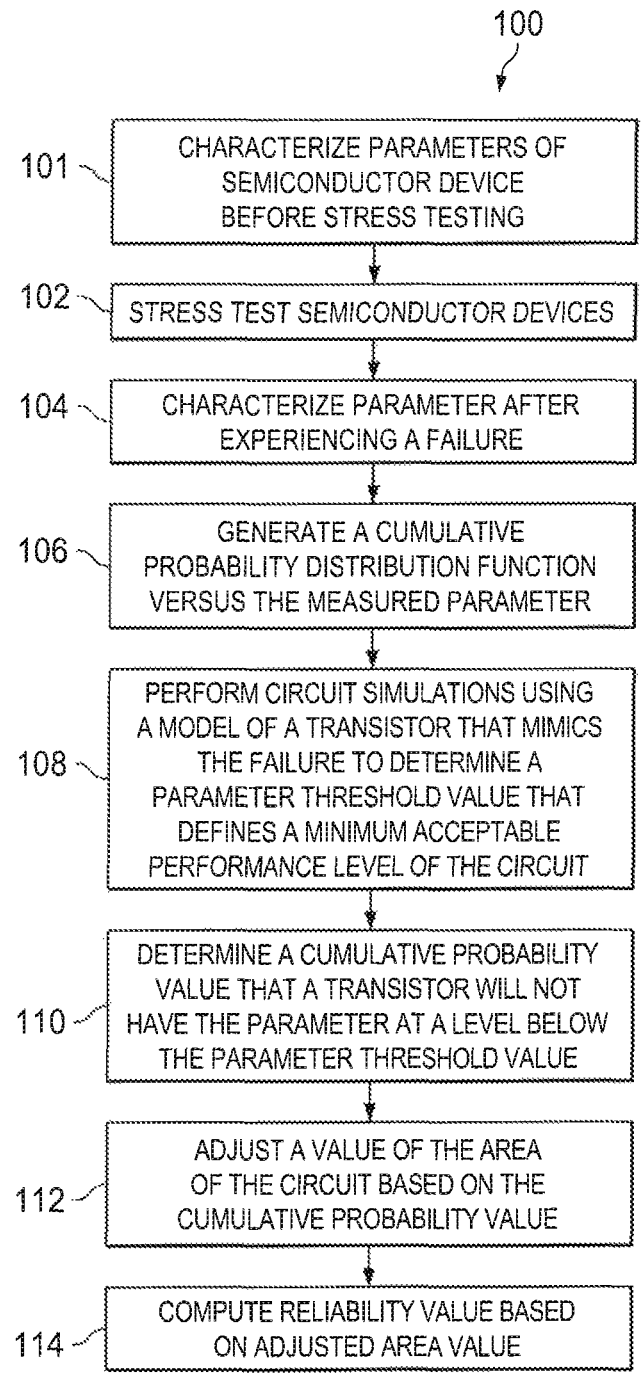
FIG. 1 shows an illustrative method for determining a reliability value based on an adjusted value of area of a semiconductor device.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Circuit and product reliability assessment has been determined from extrapolations and models based on component (e.g., transistors, resistors, metallization, etc.) failure definitions. The problem with such an approach is that reliability assessments predicted without considering the impact of a component failure on the performance of the overall circuit are typically very conservative. As a result, product performance unfortunately has been traded-off to meet the conservative component reliability model definition of failure.

One assessment of circuit reliability is failures-in-time (FIT). FIT refers to the number of expected failures per one billion device-hours. For example, a FIT of 1.0 means that one would expect to see only 1 device failure among 1 million devices operating for 1000 hours, or 10,000 device operating for 100 hours each, etc. Lower FIT values equates to higher reliability.

One type of component failure, for example, is gate oxide breakdown which refers to the destruction of the insulating properties of the oxide layer (e.g., $SiO_2$). Oxide layers are used as insulation in many parts of a semiconductor device such as gate oxide between the gate metal electrode and the semiconductor substrate. Gate oxide breakdown is caused by imposing a sufficiently large voltage on the gate of the transistor for a sufficiently long period of time. As a result, over time a conductive channel undesirably may form through the oxide layer. Longstanding trends toward smaller feature sizes have caused a commensurate reduction in the thickness of the oxide layers thereby making gate oxide breakdown a bigger problem.

Prior component reliability assessment techniques generally regarded gate oxide breakdown as a binary event meaning that all gate oxide breakdowns are equal and render the circuit inoperative. However, such is not the case. A circuit may have one or more transistors that could experience a gate oxide breakdown and, due to the particular function performed by such transistors, not render the circuit completely inoperative. Further, not all gate oxide breakdowns are the same. The resistance of the resulting channel through the oxide layer may vary substantially. Not all gate oxide breakdown events necessarily manifest themselves as a "dead short" through the oxide layers. Some gate oxide breakdown events, for example, still have a high enough resistance that the circuit continues operating within acceptable levels perhaps a lower performance level than without the gate oxide breakdown but nevertheless still at an acceptable level.

In accordance with the preferred embodiments, a reliability value is computed for a circuit taking into account the effects of component failure on the overall operation of the circuit. The disclosed technique determines the reliability value with the recognition that not all component failures render the circuit inoperative. Thus, the reliability value of the preferred embodiment is likely to be determined to indicate that the circuit is more reliable than would have been the case without taking into account effects on the circuits' operation from component failures.

FIG. 1 shows a method of computing a reliability value in accordance with various embodiments. The reliability value being computed may be, for example, a FIT value, but could be other reliability values as well. FIG. 1 will be described below in relation to FIG. 2 as well. The various operations shown in FIGS. 1 and 2 may be performed in the order shown, or in a different order, and two or more of the operations may be performed in parallel rather than serially.

Figure 2:
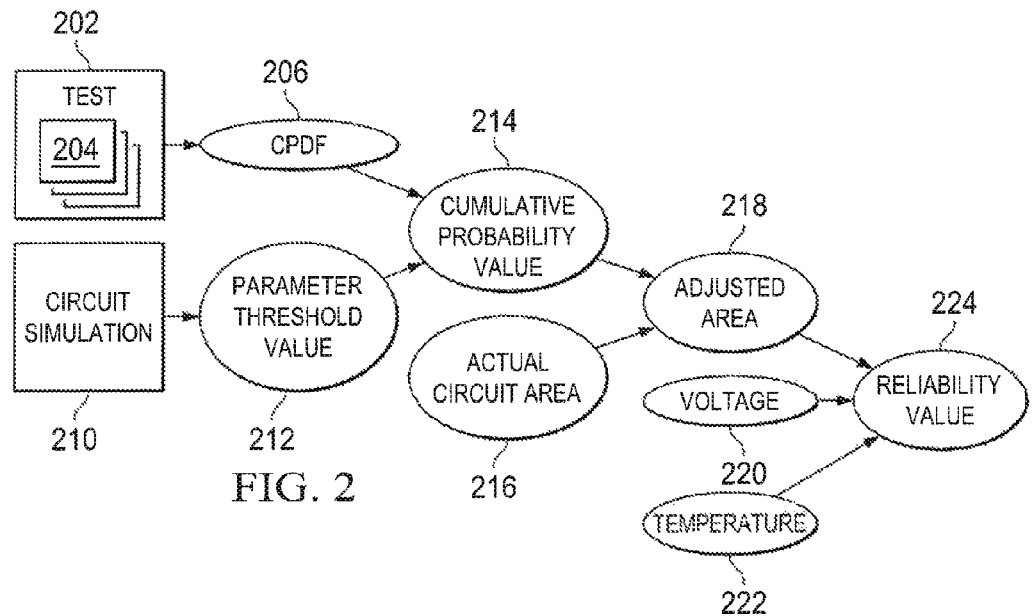
FIG. 2 further illustrates the method of FIG. 1.

At 101 in FIG. 1, the method includes characterizing parameters of semiconductor devices before performing stress testing on the devices, and then at 102 stress testing the multiple semiconductor structures. In FIG. 2, operation 102 is depicted at test operation 202 with regard to semiconductor structures 204. The semiconductor structures may be oxide capacitors, transistors, etc. The testing that is performed may be time-dependent dielectric breakdown (TDDB) testing or related testing. For example, the testing in 102/202 may include imposing a predefined voltage level on a gate electrode for a long enough period of time so as to induce a failure (e.g., a gate oxide breakdown failure, backend dielectric oxide breakdown, electro-migration, etc.). The testing may entail constant voltage time-dependent dielectric breakdown (CVTDDB) with a current compliance. The purpose of the current compliance is to limit the current that flows once the gate oxide breakdown defect is formed. Preferably, the magnitude of the current is set to a lower level than with conventional CVTDDB testing techniques (further restricting the current) as defined by what would be expected in the typical circuit application.

At 104, the method includes characterizing a parameter for a given semiconductor structure after experiencing a failure with that structure. In testing for oxide breakdown failures, the parameter may be, for example, the resistance from gate-to-source and/or from gate-to-drain of the resulting channel created through the oxide layer. While the "resistance" of the channel is referred to herein, the scope of this disclosure includes "conductance" as well. Thus, any reference to resistance is intended to refer to encompass resistance or conductance. The term "resistance" is simply used for convenience. The drain current characteristic as a function of gate and drain voltages is also monitored pre and post breakdown as are the threshold voltage (VT) of the transistor. Since changes in the drain current characteristics and VT can change the timing characteristics of a circuit the VT shift during gate oxide breakdown must be measured and then included in the simulations used to determine the circuit impact.

The area of the oxide layer of the product for which the evaluation is being done is also extracted from the design and recorded.

Figure 3:
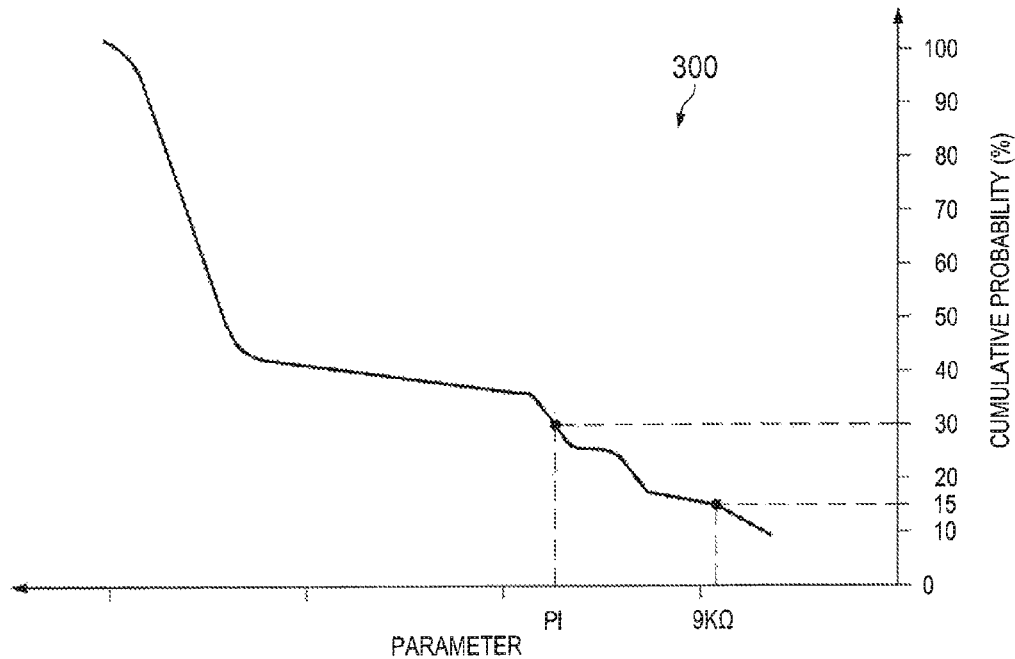
FIG. 3 illustrates a cumulative probability distribution function usable in the method of FIG. 1.

All of the semiconductor structures 204 are characterized prior testing and then tested to failure and characterized post-breakdown e.g., resistance, Vt, drain current characteristics). At 106 and as shown at 206 in FIG. 2, the method includes generating a cumulative probability distribution function (CPDF) based on the measurements made during testing 102/202. A sample of a CPDF 300 is shown in FIG. 3. The X-axis denotes the parameter being measured at 102/202. The parameter, for example, may be resistance (measured in ohms). The vertical axis denotes the cumulative probably. A value of, for example, 30% means that 30% of all of the semiconductor structures tested resulted in a parameter measurement of P1 or less. For example, if P1 is 20 KΩ, then 30% of all tested semiconductor structures had a resistance of the gate oxide channel of 20 KΩ or less. Alternatively, stated 70% of the tested structures had a resistance of greater than 20 KΩ.

At 108 in FIGS. 1 and 210 in FIG. 2, the method includes performing circuit simulations using a model of a transistor that mimics the failure tested at 102/202 to determine a parameter threshold value that defines a minimum acceptable performance level of the circuit. The circuit simulations may include SPICE or other types of simulations. The simulation process may include replacing each transistor in the circuit, one at a time, with a transistor model that mimics the failure, and assessing the overall performance of the circuit to determine whether the circuit performs acceptably. In some implementations, a new transistor model is used to replace an existing transistor model in the circuit. In other implementations, an existing transistor model is adjusted to simulate the failure. For example, adjusting the width of a transistor in a transistor model may simulate a gate oxide breakdown failure as the threshold voltage is affected. Combining this with a gate leakage term would adequately model the gate oxide breakdown without using additional components.

Figure 4:
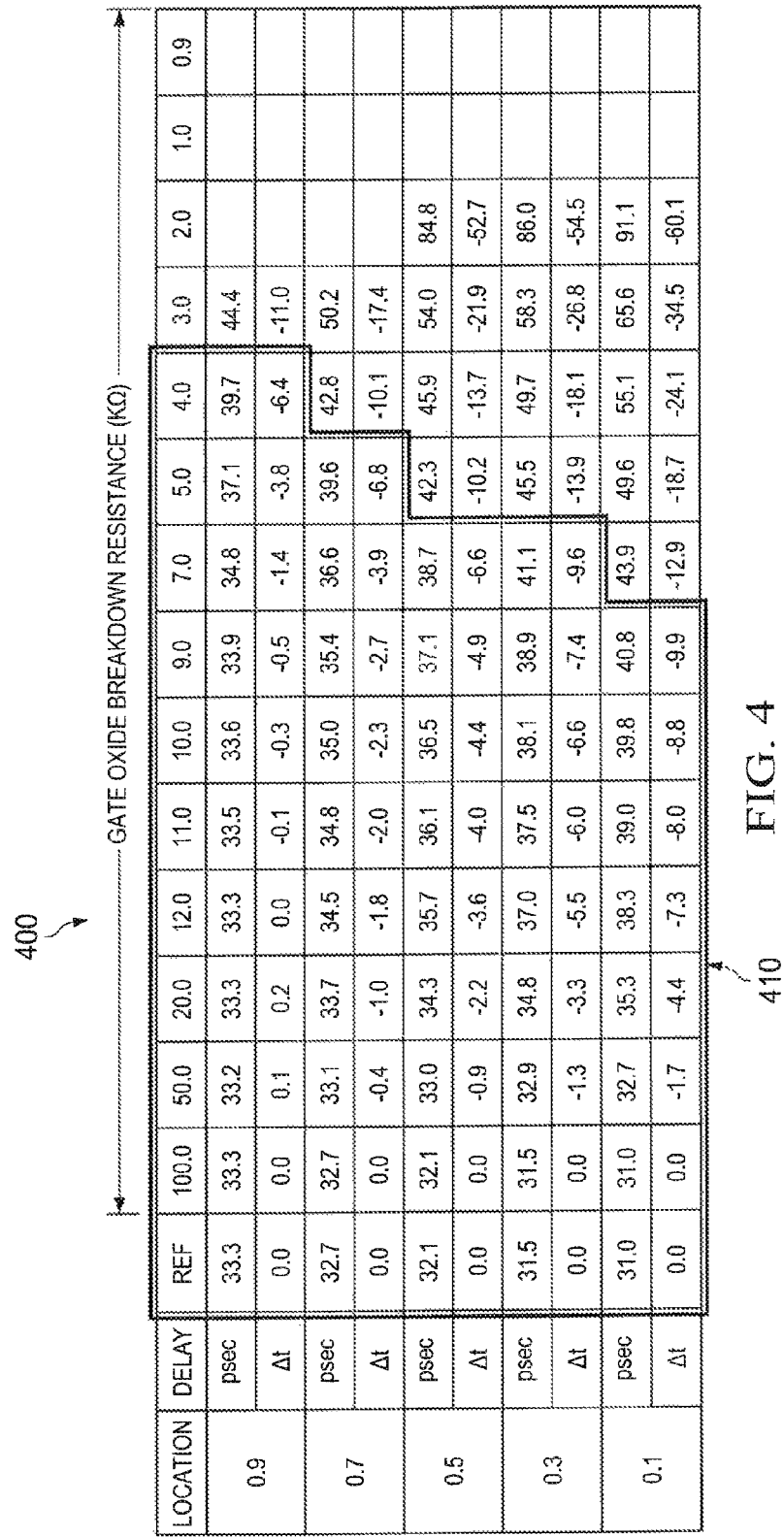
FIG. 4 shows a table of simulation value results obtained while performing the method of FIG. 1.

The parameter threshold value determined at 108/210 may be a certain value of resistance of a gate oxide breakdown channel. FIG. 4 shows illustrative test results 400 from operations 102/202. A reference semiconductor test structure is represented by the third column in the table. The reference test structure may be a transistor that has an equivalent gate width to the typical case used in the circuit. For example, most products use a transistor with a width which is three times the minimum width. Preferably, the transistors for the CVTDDB testing should be the same length and width as the typical transistor used in the product. Extractions have shown that the majority of transistors have the minimum length and twice or three times the width. The first column refers to the location within a transistor as to where the failure (e.g., gate oxide breakdown) may occur. The location values represent the percentage (in decimal form) of the location of the failure between the drain and source of a transistor. The location value 0.5 refers to the failure being located mid-way between source and drain while 90% (0.9) refers to the failure being located closer to the drain and 10% (0.1) means the failure is located close to the source. Thus, test results 400 represents five scenarios for gate oxide failures—failures located 90%, 70%, 50%, 30%, 10% between drain and source.

For each failure location, the simulation results include the overall delay determined for the circuit for various gate oxide breakdown failure levels and at different locations, as well as the amount of delay relative to the reference test structure (denoted as Δt). The time delays in FIG. 4 are provided in picoseconds (ps). For example, at location 0.9 assuming all transistors in the circuit are the reference test structure, the circuit has a delay of 33.3 ps. For a gate oxide breakdown resulting in a resistance of 100 KΩ, the delay is 33.3 ps which has a Δt (delay relative to the original defect free circuit) of 0.0 ps. For a gate oxide breakdown resulting in a resistance of 50 KΩ, the delay is 33.2 ps which has a Δt of 0.1 ps. To pick another point by way of example, for a gate oxide breakdown resulting in a resistance of 3 KO, the delay is 44.4 ps which has a Δt of −11.0 ps (i.e., a delay that is 11 ps greater than the delay associated with the reference test structure).

The test results 400 in FIG. 4 are for the circuit upon simulating one of its transistors in a gate oxide breakdown failure mode. That is, the data are for a transistor having a gate oxide breakdown at various locations between the drain and source and at various resistance levels of breakdown. Similar test results may be obtained for the circuit upon replacing other transistors (one at a time) with the model that mimics the failure mode. If a circuit has four transistors, then five sets of data as in FIG. 4 are generated—one for each transistor simulated with a defect, plus one run as a reference for a defect-free circuit.

It may be determined a priori that as long as the Δt (delay of the circuit with a gate oxide breakdown failure) relative to the circuit with only reference test structures) is less than or equal to 10 ps for all transistors in the circuit, that the operation of the circuit will be acceptable. Of course, the time delay may be other than 10 ps in other applications. An "acceptable" level of operation may vary from application to application. Conversely, the operation of the circuit may be determined not to be acceptable if one or more of transistors has experienced a gate oxide breakdown failure that results in a Δt of more than 10 ps—at least at that point the operation of the circuit for such failures cannot be guaranteed. Bold box 410 identifies all of the test results for which a gate oxide breakdown results in a Δt of less than 10 ps. For a 0.9 location, as long as the resistance is 4 KΩ or higher, the Δt is greater than 10 ps. For a 0.7 location, as long as the resistance is 5 KΩ or higher, the Δt is greater than 10 ps. For a 0.5 and 0.3 location, as long as the resistance is 7 KΩ or higher, the Δt is greater than 10 ps. For a 0.1 location, as long as the resistance is 9 KΩ or higher, the Δt is greater than 10 Ps.

The location of an actual gate oxide breakdown cannot be predicted, but what can be concluded with certainty based on test results 400 is that as long as the failure results in a resistance of at least 9 KΩ or higher, the circuit should continue operating at an acceptable level. The value of 9 KΩ in this example thus represents the parameter threshold value determined in operation 108 in FIG. 1 and at 212 in FIG. 2.

At 110, the method includes determining a cumulative probability value 214 from the CPDF that a transistor will not have the parameter (e.g., resistance) upon a failure at a level below the parameter threshold value (e.g., 9 KΩ) determined at 108/212. This operation may be performed by accessing the CPDF 300 and using the parameter threshold value as index along the X-axis to determine the corresponding cumulative probability. By way of example, FIG. 3 shows the value of 9 KΩ which maps to a cumulative probability of 15% on the vertical axis. That means that only 15% of all of the semiconductor structures 204 tested during the TDDB testing 102/202 resulted in a resistance through the gate oxide breakdown channel of 9 KΩ or less—that is, 85% of all semiconductor structures tested resulted in a higher gate oxide breakdown resistance. This means that statistically even if a transistor experiences a gate oxide breakdown failure, 85% of such failures will still result in acceptable operation of the circuit.

This knowledge about the effect on the operation of the circuit from component failures is used as follows. At 112, the area (e.g., the gate oxide area) of a given circuit (denoted in FIG. 2 at 216) is measured or otherwise known and is adjusted (218 in FIG. 2) based on the cumulative probability value 214 determined from operation 110. In some embodiments, the adjustment to the circuit's area is computed as:

Adjusted area=(actual area)*(1−PROB)

where PROB is the cumulative probability that a transistor will not have the parameter (e.g., resistance) for a failure at a level below the parameter threshold value (e.g., 9 KΩ). In the example above, PROB is 85% and thus actual gate oxide area of circuit is multiplied by 0.15.

The adjusted effective oxide area of the circuit thus will be less than the actual oxide area of the circuit. Some reliability values such as FIT values are a function, in part, of area. For example, FIT may be computed as a function of gate oxide area, voltage applied to the circuit, and temperature (e.g., average ambient temperature in which the circuit operates). By artificially lowering the gate oxide area input to the FIT computation, a lower FIT will be computed for the circuit than would have been the case without the technique described above. The computation of the FIT to be a lower number indicates that the circuit is more reliable than otherwise would have been the case with a conventionally computed FIT. The lower value of the FIT takes into account that not all gate oxide breakdown failures render the circuit inoperative. At 114, the method includes computing the reliability value (e.g., FIT) 224 based on the value of the adjusted area (218), as well as voltage 220 and temperature 222.

As noted above, FIT may be a function of gate oxide area, voltage and temperature. If the FIT is computed to be a smaller number, then it would be possible to increase the operating voltage of the circuit while maintaining the same level of the FIT than would have been the case in conventional FIT computations. That is, given the determination that the FIT for a given circuit indicates that the circuit is considerably more reliable than would have been determined by standard FIT determinations, the operating voltage for the circuit can be increased for higher performance without increasing the FIT beyond the conventionally determined level. Thus, the method may further include computing a second reliability value for the circuit without adjusting the value of the area (i.e., via a conventional technique) and then computing a voltage that can be applied to the circuit so as to result in the reliability value (e.g., FIT) but based on the adjusted area.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer implemented method, comprising:
   testing to failure a plurality of semiconductor test structures;
   measuring parameters of each of the plurality of semiconductor test structures before and after experiencing a failure;
   generating a cumulative probability distribution function (CPDF) of cumulative probability versus the measured parameter after failure for the plurality of semiconductor test structures tested;
   performing simulations using a computer system for a circuit, injecting at a single transistor location, a model of a transistor that mimics the failure to determine a parameter threshold value that defines a minimum acceptable performance level of the circuit;
   determining a cumulative probability value from the CPDF that a transistor will not have the parameter at a level below the parameter threshold value;
   adjusting a value of the area of the circuit based on the cumulative probability value; and
   computing a first reliability value based on the adjusted area value.

2. The method of claim 1 wherein the failure includes at least one of oxide breakdown and electro-migration.

3. The method of claim 1 wherein testing to failure of the plurality of semiconductor test structures comprises applying a stress voltage to each semiconductor test structure with a current constraint or compliance level that does not exceed that which would occur in the circuit under nominal load conditions.

4. The method of claim 1 further:
   computing a second reliability value for the circuit without adjusting the value of the area; and
   computing a voltage that can be applied to the circuit so as to result in the second reliability value but based on the adjusted area.

5. The method of claim 1 wherein the reliability value is a failure-in-time (FIT) value.

6. The method of claim 1 wherein performing simulations includes:
   determining a simulation model of a transistor component for a failed transistor that mimics the transistor upon experiencing the failure;
   injecting the simulation model into a circuit comprising a plurality of transistors;

simulating multiple levels of failure by adjusting the injected simulation model;

assessing whether operation of the circuit exceeds an acceptable performance level at each level of failure.

7. The method of claim 1 wherein adjusting a value of the area includes multiplying the area by a quantity that includes one minus the cumulative probability value.

8. A computer implemented method, comprising:

testing to a failure after a gate oxide breakdown event a plurality of semiconductor test structures;

measuring a resistance of each of the plurality of semiconductor test structures after experiencing a gate oxide breakdown failure;

generating a cumulative probability distribution function (CPDF) of cumulative probability versus the measured resistance after gate oxide breakdown failure for the plurality of semiconductor test structures;

performing simulations using a computer system for a circuit, injecting at a single transistor location, a model of a transistor that mimics the gate oxide breakdown failure to determine a time delay threshold value that defines a minimum acceptable performance level of the circuit;

determining a cumulative probability value from the CPDF that a transistor will not have the resistance at a level below the time delay threshold value;

adjusting a value of the area of the circuit based on the cumulative probability value; and computing a failures in time (FIT) value based on the adjusted area value.

9. The method of claim 8 wherein testing to failure of the plurality of semiconductor test structures comprises applying a stress voltage to each semiconductor test structure with a current constraint or compliance level that does not exceed that which would occur in the circuit under nominal load conditions.

10. The method of claim 8, wherein adjusting a value of the area includes multiplying the area by a quantity that includes one minus the cumulative probability value.

11. The method of claim 8 wherein adjusting a value of the area includes multiplying the area by a quantity based on the cumulative probability value.

* * * * *